(12) United States Patent
Hokenmaier

(10) Patent No.: US 7,263,638 B2
(45) Date of Patent: Aug. 28, 2007

(54) MEMORY HAVING TEST CIRCUIT

(75) Inventor: Wolfgang Hokenmaier, Burlington, VT (US)

(73) Assignee: Infineon Technologies AG, Munich (DE)

( * ) Notice: Subject to any disclaimer, the term of this patent is extended or adjusted under 35 U.S.C. 154(b) by 261 days.

(21) Appl. No.: 11/013,870

(22) Filed: Dec. 16, 2004

(65) Prior Publication Data

US 2006/0136792 A1 Jun. 22, 2006

(51) Int. Cl.
*G01C 29/00* (2006.01)

(52) U.S. Cl. .................................. 714/719; 714/723

(58) Field of Classification Search ................ 714/814, 714/718, 719, 723; 365/201
See application file for complete search history.

(56) References Cited

U.S. PATENT DOCUMENTS

| 5,570,381 A * | 10/1996 | Schofield ............... 714/814 |
| 6,072,737 A | 6/2000 | Morgan et al. |
| 6,163,863 A | 12/2000 | Schicht |
| 6,166,967 A | 12/2000 | Do |
| 6,243,309 B1 | 6/2001 | Shin |
| 6,311,299 B1 | 10/2001 | Bunker |
| 6,357,027 B1 | 3/2002 | Frankowsky |
| 6,421,794 B1 | 7/2002 | Chen et al. |
| 6,484,278 B1 | 11/2002 | Merritt et al. |
| 6,484,289 B1 | 11/2002 | Hsu |
| 6,499,120 B1 | 12/2002 | Sommer |
| 6,539,505 B1 * | 3/2003 | Dahn ........................ 714/718 |
| 6,584,025 B2 | 6/2003 | Roohparvar et al. |
| 6,643,805 B1 * | 11/2003 | Kikutake et al. ........... 714/718 |
| 6,693,841 B2 | 2/2004 | Roohparvar et al. |
| 6,751,762 B2 | 6/2004 | Antonischki |
| 6,961,273 B2 * | 11/2005 | Boldt et al. ................. 365/201 |
| 7,117,407 B2 * | 10/2006 | Boldt ........................ 714/718 |
| 2004/0049720 A1 | 3/2004 | Boehler |

FOREIGN PATENT DOCUMENTS

| DE | 10226585 | 6/2002 |
| EP | 0632468 | 6/1993 |

* cited by examiner

*Primary Examiner*—David Ton
(74) *Attorney, Agent, or Firm*—Dicke, Billig & Czaja, PLLC

(57) ABSTRACT

A memory circuit comprises a memory and a first test circuit coupled to the memory. The first test circuit is configured to compare data read from memory cells with expected data for the memory cells to provide a first set of pass/fail signals for the memory cells, compress the first set of pass/fail signals for the memory cells into a second pass/fail signal, latch the second pass/fail signal in response to a data valid signal, maintain the latch of the second pass/fail signal if the second pass/fail signal indicates a failed test, combine the second pass/fail signal and a third pass/fail signal of a second test circuit to provide a fourth pass/fail signal, and pass the fourth pass/fail signal to a third test circuit.

25 Claims, 4 Drawing Sheets

MEMORY HAVING TEST CIRCUIT

BACKGROUND

Dynamic random access memory (DRAM) production typically distinguishes between two main test stages in manufacturing after the processing of the wafer. The first main test stage includes the front end test, also known as the wafer test, which tests the silicon wafer as a whole by means of probe cards contacting the individual chips on the wafer. In this stage of manufacturing, whether defects in the memory area can be repaired by means of fuses is typically decided. The second main test stage is the back end test, also known as the module test, which tests a packaged chip or module after it has been repaired if necessary. In this stage of manufacturing, performing further repairs on a single chip is typically not possible. Therefore, the test performed can be different than the front end test, such that the location and number of fails, if any, are not needed or are needed for statistical purposes only.

Many attempts have been made by manufactures to reduce expensive test time in both the front end test and back end test. One aspect of these efforts is to deviate from the specified interface specification for the memory during test. For example, the interface can be temporarily changed so that not all pads/pins need to be contacted, which saves tester resources. Another example is to enable a test-proprietary timing specification to more efficiently test the chip at non-standardized frequencies.

Front end tests typically need to maintain information about the number and location of fails so that chips that show an acceptable (i.e., repairable) number of fails can be successfully repaired. Back end tests, however, do not need to maintain information about the number and location of fails because the chips typically cannot be repaired at this stage of manufacturing. Back end test systems typically have no means to store the location of a high number of fails or are not able to store locations of fails at all. In typical back end tests, the contents of the memory array are usually read out using the standard user interface specification for the memory, which requires the test systems to be able to read data at a frequency that is relatively high for typically available test equipment and compare the data in real-time with expected data. Using this method, the amount of data being read from a memory device at a given time will be low because of the limitations of the standard user interface (e.g., the number of data output pads).

SUMMARY

One embodiment of the present invention provides a memory circuit. The memory circuit comprises a memory and a first test circuit coupled to the memory. The first test circuit is configured to compare data read from memory cells with expected data for the memory cells to provide a first set of pass/fail signals for the memory cells, compress the first set of pass/fail signals for the memory cells into a second pass/fail signal, latch the second pass/fail signal in response to a data valid signal, maintain the latch of the second pass/fail signal if the second pass/fail signal indicates a failed test, combine the second pass/fail signal and a third pass/fail signal of a second test circuit to provide a fourth pass/fail signal, and pass the fourth pass/fail signal to a third test circuit.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
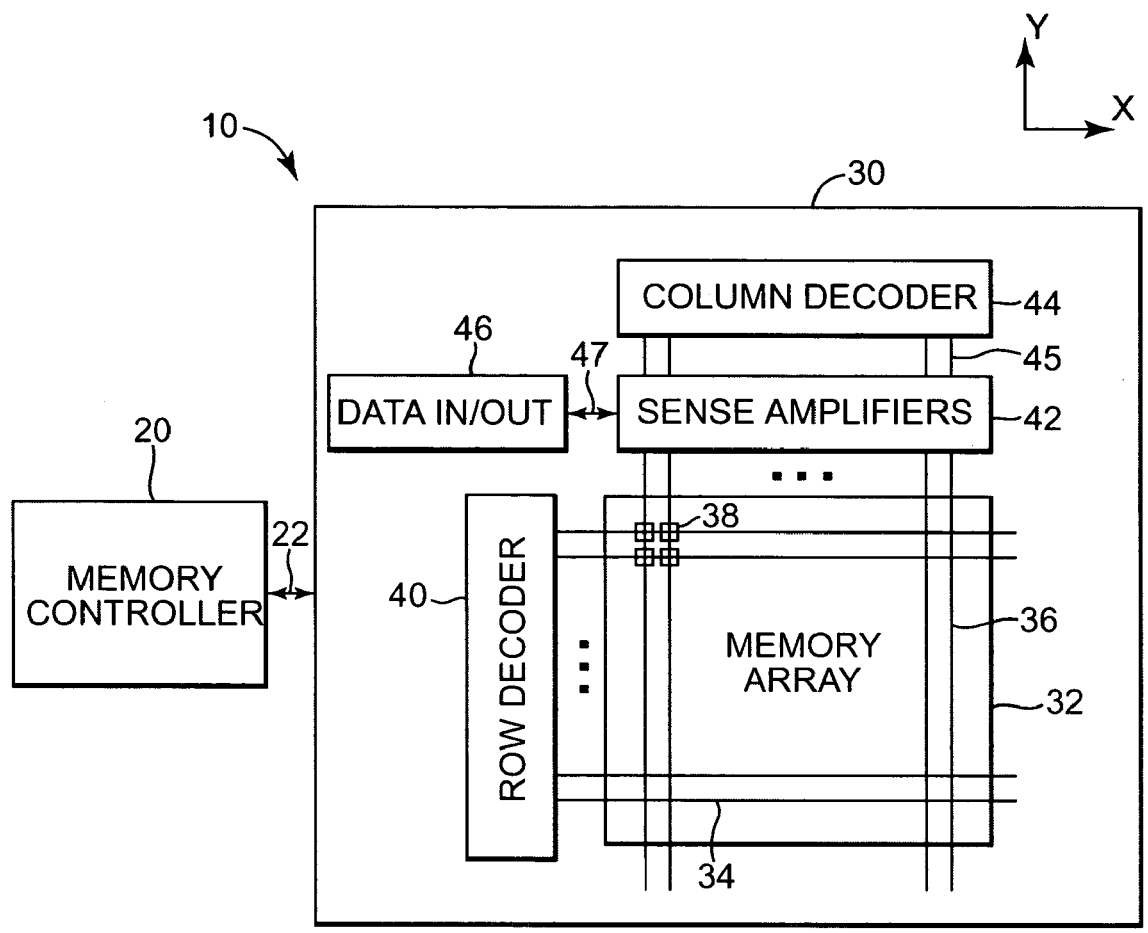
FIG. 1 is a block diagram illustrating one embodiment of a random access memory, according to the present invention.

FIG. 1 is a block diagram illustrating one embodiment of a memory 10. In one embodiment, memory 10 is a random access memory, such as a dynamic random access memory (DRAM), synchronous dynamic random access memory (SDRAM), double data rate synchronous dynamic random access memory (DDR SDRAM), double data rate two synchronous dynamic random access memory (DDR2 SDRAM), pseudo-static random access memory (PSRAM), magnetic random access memory (MRAM), or FLASH. Memory 10 includes a memory controller 20 and at least one memory bank 30. Memory bank 30 includes an array of memory cells 32, a row decoder 40, a column decoder 44, sense amplifiers 42, and data in/out circuit 46. Memory controller 20 is electrically coupled to memory bank 30 through communication link 22.

Memory 10 includes a normal operating mode and a back end test mode. Memory 10 is configured to perform a back end test in the back end test mode, which tests memory 10 after memory 10 has been fused and packaged or fused for sale as a wafer (known good die), or tests an unpackaged die for later multi-chip-packaging. With the back end test mode selected, memory 10 writes expected data from an internal register to memory cells 38 of the array of memory cells 32. With the expected data written to the memory cells 38, memory 10 reads the data stored in the memory cells 38. Memory 10 compares the data read from the memory cells 38 to the expected data from the internal register. If the data read from a memory cell 38 matches the expected data for the memory cell 38, then a memory cell pass/fail signal indicating the memory cell 38 passed the test is provided. If the data read from a memory cell 38 does not match the expected data for the memory cell 38, then a memory cell pass/fail signal indicating the memory cell 38 failed the test is provided. The pass/fail signals for each memory cell 38 are compressed into a global pass/fail signal for memory 10. The global pass/fail signal is output on a data pad of memory 10.

Conductive word lines 34, referred to as row select lines, extend in the x-direction across the array of memory cells 32. Conductive bit lines 36, referred to as column select lines, extend in the y-direction across the array of memory cells 32. A memory cell 38 is located at each cross point of a word line 34 and a bit line 36. Each word line 34 is electrically coupled to row decoder 40, and each bit line 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes a plurality of latches and data input/output (I/O) pads or pins (DQs) to transfer data between memory bank 30 and an external device. In the normal operating mode, data to be written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state. In the back end test mode, a global pass/fail signal for memory 10 is output on one of the DQs.

Memory controller 20 controls reading data from and writing data to memory bank 30. During a read operation in the normal operating mode, memory controller 20 passes the row address of a selected memory cell or cells 38 to row decoder 40. Row decoder 40 activates the selected word line 34. As the selected word line 34 is activated, the value stored in each memory cell 38 coupled to the selected word line 34 is passed to the respective bit line 36. The value of each memory cell 38 is read by a sense amplifier 42 electrically coupled to the respective bit line 36. Memory controller 20 passes a column address of the selected memory cell or cells 38 to column decoder 44. Column decoder 44 selects which sense amplifiers 42 pass data to data in/out circuit 46 for retrieval by an external device.

During a write operation in the normal operating mode, the data to be stored in array 32 is placed in data in/out circuit 46 by an external device. Memory controller 20 passes the row address for the selected memory cell or cells 38 where the data is to be stored to row decoder 40. Row decoder 40 activates the selected word line 34. Memory controller 20 passes the column address for the selected memory cell or cells 38 where the data is to be stored to column decoder 44. Column decoder 44 selects which sense amplifiers 42 are passed the data from data in/out circuit 46. Sense amplifiers 42 write the data to the selected memory cell or cells 38 through bit lines 36.

Figure 2:
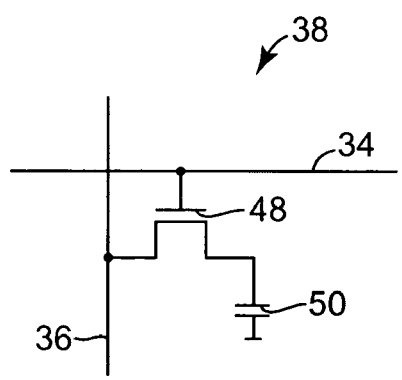
FIG. 2 is a diagram illustrating one embodiment of a memory cell.

FIG. 2 is a diagram illustrating one embodiment of one memory cell 38 in the array of memory cells 32. Memory cell 38 includes a transistor 48 and a capacitor 50. The gate of transistor 48 is electrically coupled to word line 34. The drain-source path of transistor 48 is electrically coupled to bit line 36 and capacitor 50. Capacitor 50 is charged to represent either a logic 0 or a logic 1. During a read operation, word line 34 is activated to turn on transistor 48 and the value stored on capacitor 50 is read by a corresponding sense amplifier 42 through bit line 36 and transistor 48. During a write operation, word line 34 is activated to turn on transistor 48 and the value stored on capacitor 50 is written by a corresponding sense amplifier 42 through bit line 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading or writing the memory cell 38. All memory cells 38 within the array of memory cells 32 are periodically refreshed to maintain their values.

Figure 3:
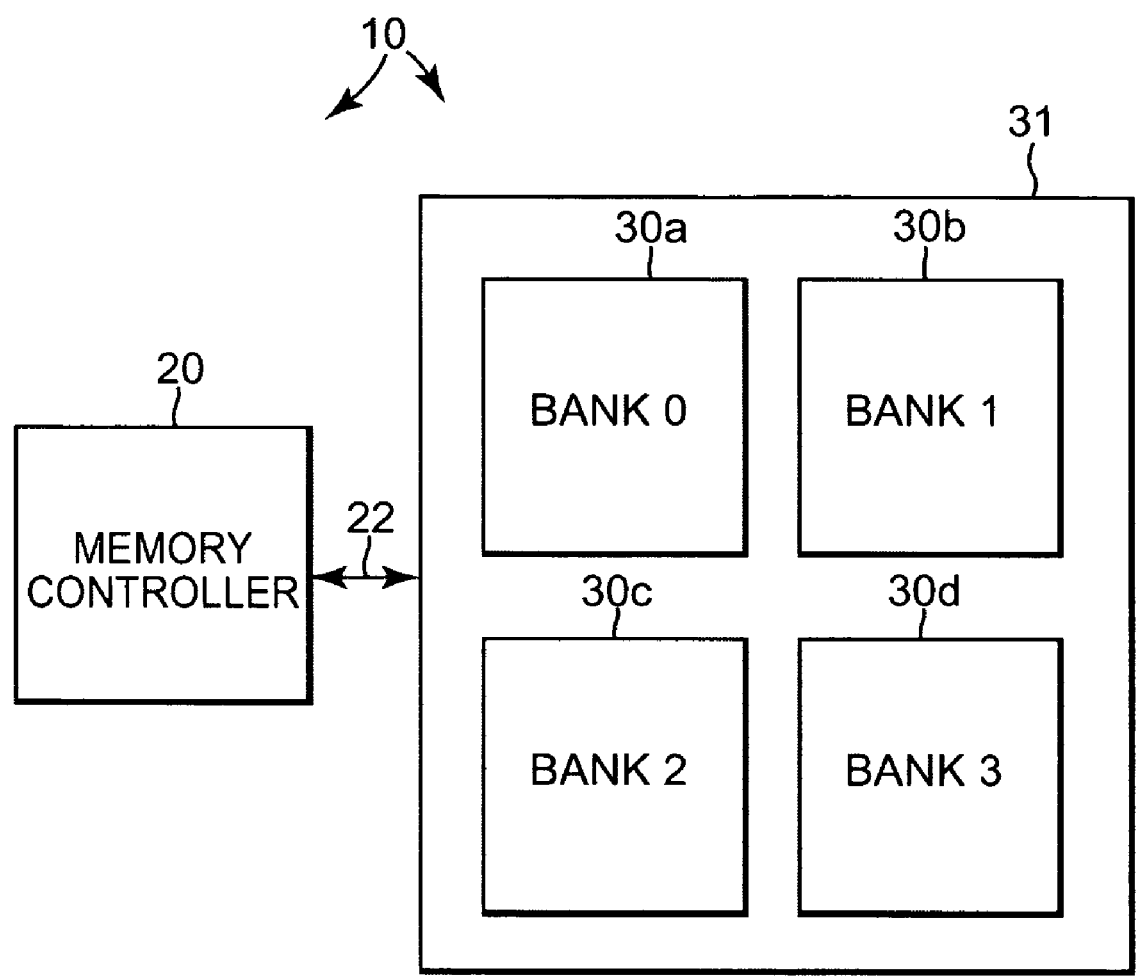
FIG. 3 is a block diagram illustrating one embodiment of a random access memory including four memory banks.

FIG. 3 is a block diagram illustrating one embodiment of memory 10 with an array of memory banks 31. The array of memory banks 31 includes four memory banks, bank zero through bank three, indicated at 30a–30d, respectively. Each memory bank 30a–30d includes similar circuitry to memory bank 30 illustrated in FIG. 1 and previously described. In one embodiment, a single data in/out circuit 46 is shared by memory banks 30a–30d. Multiple memory banks 30a–30d increase the storage capacity of memory 1.0 and in the normal operating mode reduce the access time of memory 10 as one bank can be prepared for access while another bank is being accessed. In the normal operating mode, the array of memory cells 32 of one bank 30a–30d is read from or written to at a time. In the back end test mode, memory 10 is configured in one embodiment to simultaneously write to the arrays of memory cells 32 of memory banks 30a–30d, and simultaneously read from the arrays of memory cells 32 of memory banks 30a–30d. In the back end test mode, each memory bank 30a–30d provides a back end test pass/fail signal that is combined with the back end test signals of the other memory banks 30a–30d to provide a global pass/fail signal.

Figure 4:
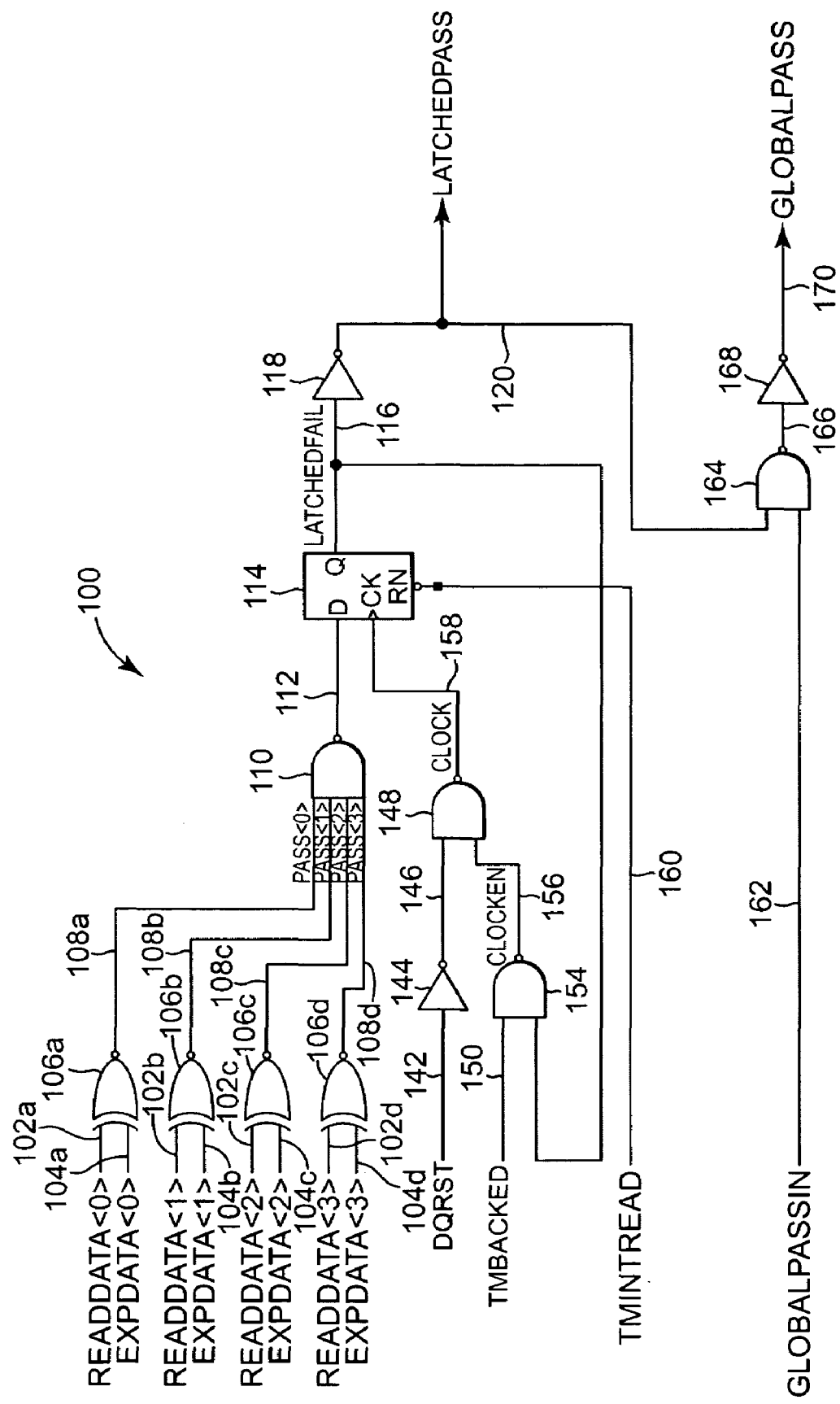
FIG. 4 is a schematic diagram illustrating one embodiment of a test circuit of the random access memory for performing a back end test.

FIG. 4 is a schematic diagram illustrating one embodiment of a test circuit 100 of one memory bank 30a–30d of memory 10 for performing the back end test. Test circuit 100 includes exclusive NOR (XNOR) gates 106a–106d, NAND gates 110, 148, 154, and 164, inverters 144, 118, and 168, and flip-flop latch 114. In one embodiment, test circuit 100 is part of column decoder 44. In one embodiment, test circuit 100 is coupled to four secondary sense amplifiers 42, which are coupled to columns 36 of the array of memory cells 32. Therefore, four memory cells 38 are tested simultaneously by test circuit 100. In one embodiment, test circuit 100 is repeated within memory 10 for every four secondary sense amplifiers 42. In this embodiment, the compression ratio is four to one, where the output of four secondary sense amplifiers representing four data bits is compressed into one bit of pass/fail information. In other embodiments, other suitable compression ratios are used, such as eight to one.

A first input of XNOR gate 106a receives the read data zero (READDATA<0>) signal on READDATA<0> signal path 102a. A second input of XNOR gate 106a receives the expected data zero (EXPDATA<0>) signal on EXP-DATA<0> signal path 104a. XNOR gate 106a is electrically coupled to a first input of NAND gate 110 through pass zero (PASS<0>) signal path 108a. A first input of XNOR gate 106b receives the read data one (READDATA<1>) signal on READDATA<1> signal path 102b. A second input of XNOR gate 106b receives the expected data one (EXPDATA<1>) signal on EXPDATA<1> signal path 104b. XNOR gate 106b is electrically coupled to a second input of NAND gate 110 through pass one (PASS<1>) signal path 108b.

A first input of XNOR gate 106c receives the read data two (READDATA<2>) signal on READDATA<2> signal path 102c. A second input of XNOR gate 106c receives the expected data two (EXPDATA<2>) signal on EXPDATA<2> signal path 104c. XNOR gate 106c is electrically coupled to a third input of NAND gate 110 through pass two (PASS<2>) signal path 108c. A first input of XNOR gate 106d receives the read data three (READDATA<3>) signal on READDATA<3> signal path 102d. A second input of XNOR gate 106d receives the expected data three (EXPDATA<3>) signal on EXPDATA<3> signal path 104d. XNOR gate 106d is electrically coupled to a fourth input of NAND gate 110 through pass three (PASS<3>) signal path 108d.

The output of NAND gate 110 is electrically coupled to input 1 of flip-flop latch 114 through signal path 112. Output Q of flip-flop latch 114 is electrically coupled to the input of inverter 118 and a first input of NAND gate 154 through latched fail (LATCHEDFAIL) signal path 116. The input of inverter 144 receives the DQ reset (DQRST) signal on DQRST signal path 142, and the output of inverter 144 is electrically coupled to a first input of NAND gate 148 through signal path 146. A second input of NAND gate 154 receives the test mode back end (TMBACKEND) signal on TMBACKEND signal path 150. The output of NAND gate 154 is electrically coupled to a second input of NAND gate 148 through clock enabled (CLOCKEN) signal path 156. The output of NAND gate 148 is electrically coupled to the clock (CK) input of flip-flop latch 114 through clock (CLOCK) signal path 158. The reset (RN) input of flip-flop latch 114 receives the test mode internal read (TMINTREAD) signal on TMINTREAD signal path 160.

The output of inverter 118 is electrically coupled to a first input of NAND gate 164 through latched pass (LATCHEDPASS) signal path 120. A second input of NAND gate 164 receives the global pass in (GLOBALPASSIN) signal on GLOBALPASSIN signal path 162. The output of NAND gate 164 is electrically coupled to the input of inverter 168 through signal path 166. The output of inverter 168 provides the global pass (GLOBALPASS) signal on GLOBALPASS signal path 170.

The READDATA<0> through READDATA<3> signals indicate the values stored in four memory cells 38. The EXPDATA<0> through EXPDATA<3> signals indicate the expected values stored in the four memory cells 38. The DQRST signal provides a rising edge when the READDATA<0> through READDATA<3> signals are stable and contain valid data read from the four memory cells 38. The TMBACKEND signal and the TMINTREAD signals are logic high to enable the back end test mode and disable the normal operating mode and logic low to disable the back end test mode and enable the normal operating mode.

XNOR gate 106a receives the READDATA<0> signal on READDATA<0> signal path 102a and the EXPDATA<0> signal on EXPDATA<0> signal path 104a, and provides the PASS<0> signal on PASS<0> signal path 108a. If the READDATA<0> signal equals the EXPDATA<0> signal, then XNOR gate 106a outputs a logic high PASS<0> signal on PASS<0> signal path 108a. If the READDATA<0> signal does not equal the EXPDATA<0> signal, then XNOR gate 106a outputs a logic low PASS<0> signal on PASS<0> signal path 108a.

XNOR gate 106b receives READDATA<1> signal on READDATA<1> signal path 102b and the EXPDATA<1> signal on EXPDATA<1> signal path 104b, and provides the PASS<1> signal on PASS<1> signal path 108b. If the READDATA<1> signal equals the EXPDATA<1> signal, then XNOR gate 106b outputs a logic high PASS<1> signal on PASS<1> signal path 108b. If the READDATA<1> signal does not equal the EXPDATA<1> signal, then XNOR gate 106b outputs a logic low PASS<1> signal on PASS<1> signal path 108b.

XNOR gate 106c receives the READDATA<2> signal on READDATA<2> signal path 102c and the EXPDATA<2> signal on EXPDATA<2> signal path 104c, and provides the PASS<2> signal on PASS<2> signal path 108c. If the READDATA<2> signal equals the EXPDATA<2> signal, then XNOR gate 106c outputs a logic high PASS<2> signal on PASS<2> signal path 108c. If the READDATA<2> signal does not equal the EXPDATA<2> signal, then XNOR gate 106c outputs a logic low PASS<2> signal on PASS<2> signal path 108c.

XNOR gate 106d receives the READDATA<3> signal on READDATA<3> signal path 102d and the EXPDATA<3> signal on EXPDATA<3> signal path 104d, and provides the PASS<3> signal on PASS<3> signal path 108d. If the READDATA<3> signal equals the EXPDATA<3> signal, then XNOR gate 106d outputs a logic high PASS<3> signal on PASS<3> signal path 108d. If the READDATA<3> signal does not equal the EXPDATA<3> signal, then XNOR gate 106d outputs a logic low PASS<3> signal on PASS<3> signal path 108d.

NAND gate 110 receives the PASS<0> signal on PASS<0> signal path 108a, the PASS<1> signal on PASS<1> signal path 108b, the PASS<2> signal on PASS<2> signal path 108c, and the PASS<3> signal on PASS<3> signal path 108d, and provides a signal on signal path 112. If one or more of the PASS<0> signal, the PASS<1> signal, the PASS<2> signal, or the PASS<3> signal is logic low, then NAND gate 110 outputs a logic high signal on signal path 112. If the PASS<0> signal, the PASS<1> signal, the PASS<2> signal, and the PASS<3> signal are logic high, then NAND gate 110 outputs a logic low signal on signal path 112.

Inverter 144 inverts the DQRST signal on DQRST signal path 142 to provide an inverted DQRST signal on signal path 146. NAND gate 154 receives the TMBACKEND signal on TMBACKEND signal path 150 and the LATCHEDFAIL signal on LATCHEDFAIL signal path 116, and provides the CLOCKEN signal on CLOCKEN signal path 156. In response to a logic low TMBACKEND signal or a logic low LATCHEDFAIL signal, NAND gate 154 outputs a logic high CLOCKEN signal. In response to a logic high TMBACKEND signal and a logic high LATCHEDFAIL signal, NAND gate 154 outputs a logic low CLOCKEN signal.

NAND gate 148 receives the inverted DQRST signal on signal path 146 and the CLOCKEN signal on CLOCKEN signal path 156, and provides the CLOCK signal on CLOCK signal path 158. In response to a logic low inverted DQRST signal or a logic low. CLOCKEN signal, NAND gate 148 outputs a logic high CLOCK signal. In response to a logic high inverted DQRST signal and a logic high CLOCKEN signal, NAND gate 148 outputs a logic low CLOCK signal.

Flip-flop latch 114 receives the signal on signal path 112, the CLOCK signal on CLOCK signal path 158, and the TMINTREAD signal on TMINTREAD signal path 160. Flip-flop latch 114 provides the LATCHEDFAIL signal on LATCHEDFAIL signal path 116. With a logic low TMINTREAD signal, flip-flop latch 114 outputs a logic low LATCHEDFAIL signal. With a logic high TMINTREAD signal, output Q of flip-flop latch 114 is based on the signal on signal path 112 and the CLOCK signal. In response to a rising edge of the CLOCK signal, flip-flop latch 114 latches the signal on signal path 112. Flip-flop latch 114 provides the latched signal to output Q until the next rising edge of the CLOCK signal, where the signal on signal path 112 is again latched to capture pass/fail information for the next four memory cells 38. Inverter 118 inverts the LATCHEDFAIL signal on LATCHEDFAIL signal path 116 to provide the LATCHEDPASS signal on LATCHEDPASS signal path 120. In one embodiment, the LATCHEDPASS signal is passed to other circuits (not shown) to perform additional functions for the front and back end tests.

NAND gate 164 receives the LATCHEDPASS signal on LATCHEDPASS signal path 120 and the GLOBALPASSIN signal on GLOBALPASSIN signal path 162, and provides an output signal on signal path 166. In response to a logic low LATCHEDPASS signal or a logic low GLOBALPASSIN signal, NAND gate 164 outputs a logic high signal on signal path 166. In response to a logic high LATCHEDPASS signal and a logic high GLOBALPASSIN signal, NAND gate 164 outputs a logic low signal on signal path 166. Inverter 168 inverts the signal on signal path 166 to provide the GLOBALPASS signal on GLOBALPASS signal path 170.

The GLOBALPASSIN signal is provided by the GLOBALPASS signal from the previous test circuit 100 of the same memory bank 30a–30d of memory 10. The GLOBALPASS signal provides the GLOBALPASSIN signal of the next test circuit 100 of the same memory bank 30a–30d of memory 10. The first test circuit 1100 of the same memory bank 30a–30d of memory 10 receives a GLOBALPPASSIN signal clamped to a logic high. The last test circuit 100 of the same memory bank 30a–30d of memory 10 provides a GLOBALPASS signal indicating a pass/fail value for the memory bank 30a–30d.

In operation, the TMBACKEND signal and the TMINTREAD signal are transitioned to logic high to enable the back end test mode for memory 10. Expected data (EXPDATA<0:3>) from an internal register is written to memory cells 38 of memory array 32. The data in memory cells 38 is then read to provide READDATA<0:3>. The READDATA<0> through the READDATA<3> signals are compared to the EXPDATA<0> through the EXPDATA<3> signals by XNOR gates 106a–106d, respectively. If one or more of the READDATA<0> through READDATA<3> signals do not match the corresponding EXPDATA<0> through EXPDATA<3> signals, then NAND gate 110 outputs a logic high signal indicating a failed test. If the READDATA<0> through READDATA<3> signals match the corresponding EXPDATA<0> through EXPDATA<3> signals, then NAND gate 110 outputs a logic low signal indicating a passed test.

The logic high signal or the logic low signal from NAND gate 110 is latched by flip-flop latch 114 on the rising edge of the DQRST signal, which provides a rising edge of the CLOCK signal. The DQRST signal provides a rising edge when the data read from memory array 32 is stable. If flip-flop latch 114 latches a logic low signal, flip-flop latch 114 remains active to latch the next signal from NAND gate 110 on the next rising edge of the DQRST signal indicating the values read from the next four memory cells 38 are stable. If flip-flop latch 114 latches a logic high signal, flip-flop latch 114 maintains the latch of the logic high signal and is no longer updated on subsequent rising edges of the DQRST signal.

Flip-flop latch 114 maintains the logic high signal in response to the LATCHEDFAIL signal transitioning to logic high, which maintains a logic high CLOCK signal through NAND gates 154 and 148. With the logic high CLOCK signal, flip-flop latch 114 maintains the latch of the logic high signal indicating a failed test, therefore maintaining a logic high LATCHEDFAIL signal. The LATCHEDFAIL signal is combined with other pass/fail signals from other test circuits 100 of the same memory bank 30a–30d of memory 10 by NAND gate 164 to provide the GLOBALPASS signal on GLOBALPASS signal path 170. With a logic high LATCHEDFAIL signal on one or more test circuits 100 of the memory bank, the GLOBALPASS signal is logic low and indicates a failed test for the memory bank. With a logic low: LATCHEDFAIL signal on all test circuits 100 of the memory bank, the GLOBALPASS signal is logic high and indicates a passed test for the memory bank.

Figure 5:
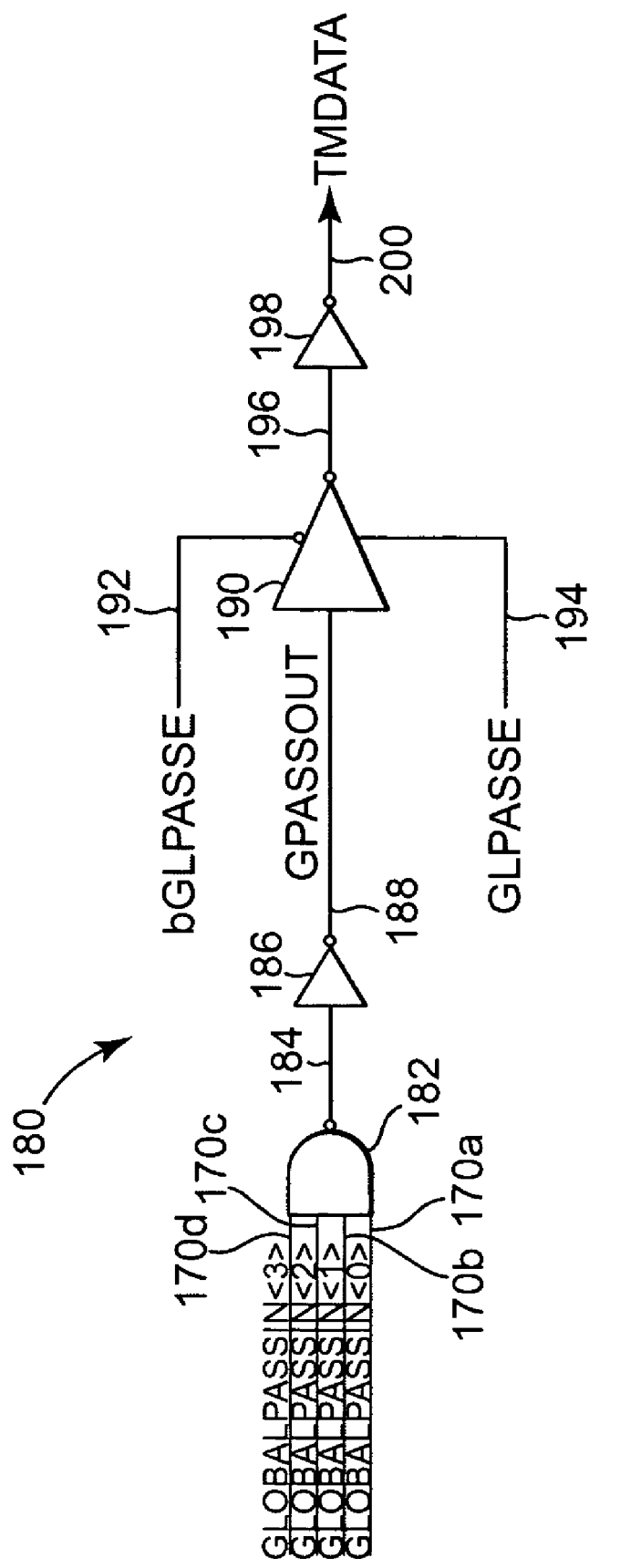
FIG. 5 is a schematic diagram illustrating one embodiment of a test circuit of the random access memory for combining and outputting the test data from four memory banks.

FIG. 5 is a schematic diagram illustrating one embodiment of a test circuit 180 of memory 10 for combining and outputting the GLOBALPASS signals from the last test circuit 100 of each memory bank 30a–30d to provide a single global pass out (GPASSOUT) signal for memory banks 30a–30d of memory 10. Test circuit 180 includes NAND gate 182, inverting tri-state buffer 190, and inverters 186 and 198. In one embodiment, test circuit 180 is part of data in/out circuit 46. A first input of NAND gate 182 receives the GLOBALPASSIN<3> signal on GLOBALPASSIN<3> signal path 170d from memory bank three 30d. A second input of NAND gate 182 receives the GLOBALPASSIN<2> signal on GLOBALPASSIN<2> signal path 170c from memory bank two 30c. A third input of NAND gate 182 receives the GLOBALPASSIN<1> signal on GLOBALPASSIN<1> signal path 170b from memory bank one 30b. A fourth input of NAND gate 182 receives the GLOBALPASSIN<0> signal on GLOBALPASSIN<0> signal path 170a from memory bank zero 30a.

The output of NAND gate 182 is electrically coupled to the input of inverter 186 through signal path 184. The output of inverter 186 is electrically coupled to the input of inverting tri-state buffer 190 through GPASSOUT signal path 188. The logic low enable input of inverting tri-state buffer 190 receives the inverted global pass enable (bGLPASSE) signal on bGLPASSE signal path 192, and the logic high enable input of inverting tri-state buffer 190 receives the global pass enable (GLPASSE) signal on GLPASSE signal path 194. The output of inverting tri-state buffer 190 is electrically coupled to the input of inverter 198 through signal path 196. The output of inverter 198 provides the test mode data (TMDATA) signal on TMDATA signal path 200.

If the GLOBALPASSIN<3> signal, the GLOBALPASSIN<2>, the GLOBALPASSIN<1> signal, and the GLOBALPASSIN<0> signal are logic high, then NAND gate 182 outputs a logic low signal on signal path 184. Inverter 186 inverts the logic low signal on signal path 184 to provide a logic high GPASSOUT signal indicating memory 10 passed the back end test. If one of the GLOBALPASSIN<3> signal, the GLOBALPASSIN<2>, the GLOBALPASSIN<1> signal, or the GLOBALPASSIN<0> signal is logic low, then NAND gate 182 outputs a logic high signal on signal path 184. Inverter 186 inverts the logic high signal on signal path 184 to provide a logic low GPASSOUT signal indicating memory 10 failed the back end test.

In the back end test mode with the GLPASSE signal logic high and the bGLPASSE signal logic low, inverting tri-state buffer 190 is enabled and passes the GPASSOUT signal to signal path 196. Inverter 198 inverts the signal on signal path 196 to provide the TMDATA signal on TMDATA signal path 200. The TMDATA signal is passed to a data pad of memory 10 where it can be read by an external test circuit. In the normal operating mode, or for other back end test mode functions, the GLPASSE signal is logic low and the bGLPASSE signal is logic high. With the GLPASSE signal logic low and the bGLPASSE signal logic high, inverting tri-state buffer 190 is disabled and the output of inverting tri-state buffer 190 is high impedance to allow other signals to be passed to the data pad.

Embodiments of the invention provide a back end test mode for testing a memory by writing test data to and reading test data from multiple memory banks simultaneously. In addition, the test results from individual memory cells are combined internally by the memory within each memory bank, and the test results from each memory bank are further combined to provide a signal pass/fail test result for the memory. The time for performing a back end test on a memory can be reduced substantially in comparison to back end testing methods that use the standard memory interface.

What is claimed is:

1. A memory circuit comprising:
   a memory; and
   a first test circuit coupled to the memory, the first test circuit configured to:
   compare data read from memory cells with expected data for the memory cells to provide a first set of pass/fail signals for the memory cells;
   compress the first set of pass/fail signals for the memory cells into a second pass/fail signal;
   latch the second pass/fail signal in response to a data valid signal;
   maintain the latch of the second pass/fail signal if the second pass/fail signal indicates a failed test;
   combine the second pass/fail signal and a third pass/fail signal of a second test circuit to provide a fourth pass/fail signal; and
   pass the fourth pass/fail signal to a third test circuit.

2. The memory of claim 1, wherein the first test circuit is configured to compare data read from four memory cells with expected data for the four memory cells to provide a first set of four pass/fail signals for the four memory cells.

3. The memory of claim 1, wherein the second test circuit is configured the same as the first test circuit, and wherein the third test circuit is configured the same as the first test circuit.

4. The memory of claim 1, wherein the memory comprises a dynamic random access memory.

5. The memory of claim 1, wherein the memory comprises a synchronous dynamic random access memory.

6. The memory of claim 1, wherein the memory comprises a double data rate synchrounous dynamic random access memory.

7. The memory of claim 1, wherein the memory comprises a double data rate two synchrounous dynamic random access memory.

8. A memory comprising:
   a first array of memory cells;
   a plurality of compare circuits configured to compare data read from a portion of the first array of memory cells with expected data for the portion of the first array of memory cells to provide a first set of pass/fail signals for the portion of the first array of memory cells;
   a first compression circuit configured to compress the first set of pass/fail signals into a second pass/fail signal;
   a latch configured to latch the second pass/fail signal in response to a data valid signal; and
   a merge circuit configured to merge the second pass/fail signal with a third pass/fail signal to provide a fourth pass/fail signal indicating the pass/fail status for the first array of memory cells.

9. The memory of claim 8, wherein the latch comprises a flip-flop latch configured to latch the second pass/fail signal in response to a rising edge of the data valid signal.

10. The memory of claim 8, wherein the latch is configured to maintain the latch of the second pass/fail signal in response to subsequent data valid signals if the second pass/fail signal indicates a failed test.

11. The memory of claim 8, wherein the plurality of compare circuits comprises four compare circuits configured to compare data read from four memory cells with expected data for the four memory cells to provide a first set of four pass/fail signals for the four memory cells.

12. The memory of claim 8, further comprising:
   a second compression circuit configured to receive the fourth pass/fail signal and a fifth pass/fail signal from a second array of memory cells and provide a global pass/fail signal for first array of memory cells and the second array of memory cells.

13. The memory of claim 12, further comprising:
   a tri-state buffer configured to pass the global pass/fail signal to a data pad in response to an enable signal.

14. A memory comprising:
   means for writing expected data to a portion of an array of memory cells;
   means for reading data from the portion of the array of memory cells;
   means for comparing the data read from the portion of the array of memory cells to the expected data to provide a set of first pass/fail signals for the portion of the array of memory cells, each memory cell in the portion of the array of memory cells having one first pass/fail signal;
   means for merging the set of first pass/fail signals for the portion of the array of memory cells to provide a second pass/fail signal; and
   means for latching the second pass/fail signal in response to a data valid signal.

15. The memory of claim 14, further comprising:
   means for maintaining the latch of the second pass/fail signal in response to subsequent data valid signals if the second pass/fail signal indicates a failed test.

16. The memory of claim 14, further comprising:
   means for combining the latched second pass/fail signal with a third pass/fail signal for another portion of the array of memory cells to provide a global pass/fail signal.

17. The memory of claim 16, further comprising:
   means for passing the global pass/fail signal to a data pad.

18. A method for testing a memory, the method comprising:
   comparing data read from a first set of memory cells of a first memory bank with expected data for the first set of memory cells to provide a first set of pass/fail signals for the first set of memory cells;
   compressing the first set of pass/fail signals for the first set of memory cells into a second pass/fail signal;
   latching the second pass/fail signal in response to a data valid signal; and
   maintaining the latch of the second pass/fail signal in response to subsequent data valid signals if the second pass/fail signal indicates a failed test.

19. The method of claim 18, further comprising:
   comparing data read from a second set of memory cells of the first memory bank with expected data for the second set of memory cells to provide a second set of pass/fail signals for the second set of memory cells;
   compressing the second set of pass/fail signals for the second set of memory cells into a third pass/fail signal;
   latching the third pass/fail signal in response to the data valid signal; and
   maintaining the latch of the third pass/fail signal in response to subsequent data valid signals if the third pass/fail signal indicates a failed test.

20. The method of claim 19, further comprising:
   combining the second pass/fail signal and the third pass/fail signal to provide a fourth pass/fail signal for the first memory bank.

21. The method of claim 20, further comprising:
comparing data read from a third set of memory cells of a second memory bank with expected data for the third set of memory cells to provide a third set of pass/fail signals for the third set of memory cells;
compressing the third set of pass/fail signals for the third set of memory cells into a fifth pass/fail signal;
latching the fifth pass/fail signal in response to the data valid signal; and
maintaining the latch of the fifth pass/fail signal in response to subsequent data valid signals if the fifth pass/fail signal indicates a failed test.

22. The method of claim 21, further comprising:
comparing data read from a fourth set of memory cells of the second memory bank with expected data for the fourth set of memory cells to provide a fourth set of pass/fail signals for the fourth set of memory cells;
compressing the fourth set of pass/fail signals for the fourth set of memory cells into a sixth pass/fail signal;
latching the sixth pass/fail signal in response to the data valid signal; and
maintaining the latch of the sixth pass/fail signal in response to subsequent data valid signals if the sixth pass/fail signal indicates a failed test.

23. The method of claim 22, further comprising:
combining the fifth pass/fail signal and the sixth pass/fail signal to provide a seventh pass/fail signal for the second memory bank.

24. The method of claim 23, further comprising:
combining the fourth pass/fail signal and the seventh pass/fail signal to provide a global pass/fail signal for the first memory bank and the second memory bank.

25. A method for testing a memory, the method comprising:
simultaneously writing expected data to memory cells of a plurality of memory banks of a memory;
simultaneously reading data from the memory cells of the plurality of memory banks of the memory;
simultaneously comparing the data read from the memory cells to the expected data to provide a test result for each memory bank;
latching the test result for each memory bank in response to a data valid signal for each memory bank; and
combining the test result for each memory bank into a global test result for the memory.

* * * * *